Sept. 19, 1961 R. D. BROWN, JR 3,001,104
WIRING SYSTEMS COMPRISING PANELS, COMPONENTS, AND BENT LEAD WIRES
Filed July 5, 1956
FIG. 1.
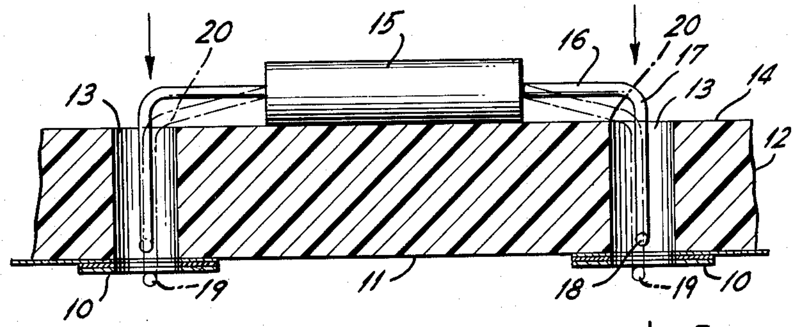
FIG. 2.
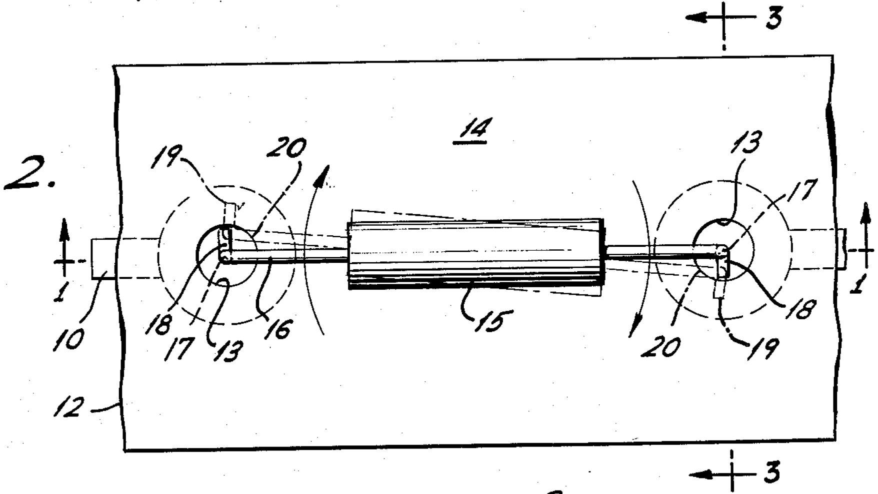
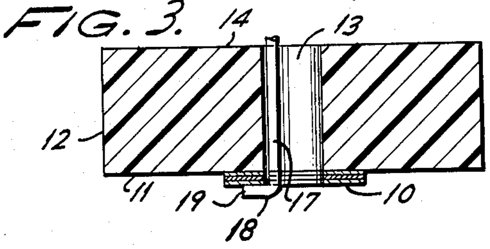
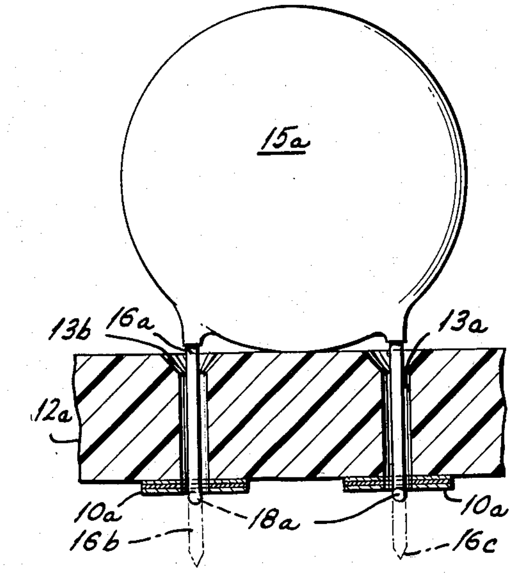
FIG. 4.
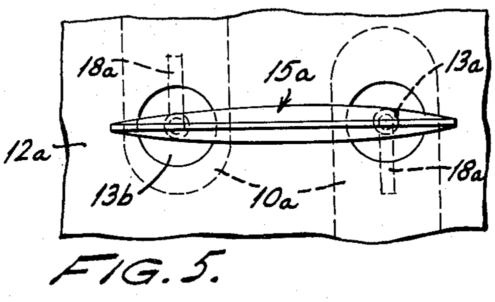
FIG. 5.

United States Patent Office 3,001,104
Patented Sept. 19, 1961

3,001,104
WIRING SYSTEMS COMPRISING PANELS, COMPONENTS, AND BENT LEAD WIRES

Reynolds D. Brown, Jr., Ambler, Pa., assignor to Philco Corporation, Philadelphia, Pa., a corporation of Pennsylvania Filed July 5, 1956, Ser. No. 596,021
2 Claims. (Cl. 317—101)

The present invention relates to circuit components, such as resistors, transistors, detectors, capacitors, condensers, etc. and to the fabrication of circuit assemblies such as the so-called printed circuit panels, with such components mounted thereon.

It is a primary object of the invention to provide a simple expedient for associating such components with a printed circuit or the like. Another object is to accomplish the assembly and connection of the components with the panel or the like both quickly and inexpensively, and to facilitate the provision of suitable soldering connections. It is a further object of this invention to make the soldering connections particulary strong, permanent and sound. This was found possible by mounting the components so as to minimize stresses applied to the solder joints. At the same time it was found possible to make the completion of great numbers of the soldering connections speedier and simpler by holding the components more firmly to the panel, before and during as well as after the soldering operations, thereby also avoiding inadvertent loss of inserted components before and during the soldering.

In pursuance of these objects, a simple embodiment of the invention uses a pair of electrical lead wires of a component to provide four or more points of securement between the component and a panel. This is achieved by certain bending or metal deforming procedures applied to lead wires or other lead members of components, partly before and partly after the so-called inserting of the component. The details will become clear from a study of the drawing appended hereto, wherein:

FIGURE 1 is a sectional, edgewise view of a panel with a component in process of being mounted thereon in accordance with the present invention, the section being taken along line 1—1 of FIGURE 2. FIGURE 2 is a plan view of the parts shown in FIGURE 1, and FIGURE 3 is a transverse section taken along line 3—3 in FIGURE 2.

FIGURE 4 is a view generally similar to that of FIGURE 1 but showing a different type of component and a somewhat different type of panel, and FIGURE 5 is a view generally similar to FIGURE 2 but showing the parts of FIGURE 4.

Referring first to FIGURE 1, a system of printed circuit portions 10 is applied on one surface 11 of a base unit or panel 12; the printed circuit portions being shown in this figure as including a plurality of layers, in accordance with principles disclosed elsewhere and of no particular importance for the present invention. The base or panel 12 has openings 13 to accommodate leads for electrical connection between the printed circuit and components disposed on the other surface 14 of the base; such a component being shown at 15 and being of the well known type having axial lead wires.

According to the invention each axial lead wire is bent to provide three successive and contiguous portions angularly related to one another; the axial portion 16 located next to the component being so arranged that when the component is positioned on the base, said portion is normally spaced from the base surface 14. Each lead wire also has an intermediate portion 17 and an additional portion 18, shown as a terminal or hook portion for solder connection to a circuit element 10; and the portions 17 and 18 are shown as registering with and entering into the openings 13 provided for the mounting of the component. The intermediate portions 17 are of such length that when the component has been placed onto the base the terminal portions 18 do not—as yet—project beyond the base surface 11 opposite the component, whereon the printed circuit 10 is applied. This arrangement is shown in full lines in FIGURE 1. However, as shown in broken lines in the same figure and further indicated by the two vertical arrows, the axial lead portions 16 can be deformed by bending them toward the panel surface 14, whereupon the end or hook portions 18 project beyond said opposite panel surface 11.

Referring next to FIGURE 2: the hook portions 18 extend crosswise with respect to the longitudinal axis of the component, and accordingly, crosswise of a line between the openings 13. More particularly, the hook portions extend in opposite crosswise directions with respect to said axis and line, to end points 19. By reference to FIGURES 1 and 2 it will be noted that the portions 16, 17 of both wires lie in a single vertical plane and that the portions 18 of both wires lie in a single horizontal plane.

By means of these features the mounting of the component on the printed circuit panel is readily accomplished, after the depressing of portions 16, by imparting a rotational motion to cause hooking engagement of the portions 18 with printed circuit portions 10 adjacent the holes 13, as suggested by the arcuate arrows; the original positions being shown in full lines and the engaged position being shown in broken lines.

The latter position is additionally shown in FIGURE 3. It will here be noted that the arrangement as shown provides snug engagement between the several parts, including the terminal lead portions 18 and the printed circuit 10.

The bent axial wire portions 16, shown in broken lines in FIGURES 1 and 2, serve as tension rods, secured to the panel at the corners 20, 20 of the panel material adjacent to the holes 13, thus providing two points 20, 20 of securement between the component and the top of the panel. In addition, as shown in FIGURE 3, the engaged hook portions 18, 18 serve as beams, each forming part of a bell crank lever 17, 18, thus providing at least two more points 19, 19 of securement, between the component and the underside of the panel. Thus at least four points 19, 19, 20, 20 of securement, forming corners of a quadrangle, are provided. This in turn prevents accidental disassociation of the component and panel incident to further operations, such as the transportation of the panel to a soldering station, the soldering operation itself and subsequent transportation and the like.

The soldering may be performed by various methods, which need not be described herein since they form no particular part of this invention. It is emphasized, however, that particularly good electrical connection is assured by the soldering of terminal and circuit portions of the present types. The reason is that, by virtue of the four-point or multiple point securement mentioned, the subsequent, unavoidable vibrations of the panel and of the components thereon cause no substantial relative motion between the positively interengaged elements 10, 18, thereby avoiding the weakening and eventual breaking of the solder connection which is otherwise likely to occur.

FIGURES 4 and 5 show a component 15*a* of the type frequently referred to as disc capacitor, which has the approximate shape of a disc standing edgewise on a circuit panel 12*a* and wherein a pair of elongated lead members or wires 16*a* are secured to the component and extend from relatively adjacent edge portions thereof in directions parallel with one another and with the plane of the disc. These wires may originally be straight along their entire length, as indicated in broken lines at **16*b*; and the insertion of the component on the panel may be achieved by relative motion between the component and the panel in such a way as to move the straight wires into and partly through correspondingly spaced holes 13*a* in the panel. The holes need not be much larger than the wires themselves, although it may be desirable to countersink these holes as shown at 13*b* and to point the wires as shown at 16*c*** in order to facilitate the insertion.

The mounting procedure to be employed in connection with the embodiment of FIGURES 4 and 5 differs from that described above in that the forming of the terminal and circuit-engaging hook portions occurs after the insertion, whereas no bending of axial leads or the like is here performed at such time. The hook portions **18*a* are again shown as being bent so that they extend in a single plane, normal to the plane of the disc and of the wire portions 16*a* and parallel to the underside of the panel. More particularly they are again bent at angles to a line between the insertion holes 13*a*** and in parallel directions, opposite to one another. Such bending can be conveniently and efficiently achieved by means of a simple rotary tool, such as that disclosed in the co-pending application Serial No. 523,188, filed on July 20, 1955, by Walter Stuhre and assigned to the assignee of the present invention, now Patent 2,893,010.

The hook portions **18*a* of FIGURE 5 are shown as being somewhat longer than the hook portions 18** of FIGURE 2. However, the hook portions generally cannot be made any longer than shown, since the printed circuit elements are narrow, closely spaced and irregularly formed.

The strength of the mounting obtained is dependent on a number of features in addition to the geometry of the support points; for instance, it is dependent on the tensile strength and similar characteristics of the materials used for the panel, the component and the lead wires and on the exact dimensions thereof. Such details may vary widely, since numerous types of components and several types of panels are presently known. In connection with many, if not all, of those types of components and panels the lead member structures and the fabricating methods described provide easy as well as safe mounting, by means of materials and procedural elements adding substantially no extra cost to the basic cost of a fabricated panel.

Further modifications of the basic concept hereof are possible. While only two embodiments of the new structure have been illustrated and described, it should be understood that the details thereof are not to be construed as limitative of the invention except insofar as set forth in the following claims.

I claim:

1. In a wiring system, at least one electrical component; a wiring panel structure; and means for mounting said component upon, and upstanding from, one side of said panel structure, said means comprising a pair of lead wires both extending from said electrical component on said one side of the panel, through the panel structure and to the other side thereof to hold the component to the panel, each lead wire having a portion projecting on and engaging said other side; the latter wire portions extending in directions substantially parallel to the panel and lateral of a straight line between the points where the wires extend through the panel.

2. In a system as described in claim 1, the feature that said directions of said portions of the lead wires are normal to said straight line.

References Cited in the file of this patent

UNITED STATES PATENTS

| | | |
|---|---|---|
| 1,514,618 | Ide | Nov. 11, 1924 |
| 1,905,471 | Kent | Apr. 25, 1933 |
| 2,270,166 | Hiensch | Jan. 13, 1942 |
| 2,361,537 | Frank | Oct. 31, 1944 |
| 2,502,291 | Taylor | Mar. 28, 7950 |
| 2,754,486 | Hathorn | July 10, 1956 |
| 2,777,193 | Albright | Jan. 15, 1957 |
| 2,844,807 | McMulkin | July 22, 1958 |
| 2,898,518 | Lynn | Aug. 4, 1959 |
| 2,898,519 | Foster | Aug. 4, 1959 |

OTHER REFERENCES

Tele-Tech & Electronic Industries, November 1953, page 47.